(12) United States Patent
Yamamoto et al.

(10) Patent No.: US 9,390,995 B2
(45) Date of Patent: Jul. 12, 2016

(54) SEMICONDUCTOR DEVICE AND METHOD OF MANUFACTURING THE SAME

(75) Inventors: Kei Yamamoto, Tokyo (JP); Kazuhiro Tada, Tokyo (JP); Hideki Komori, Tokyo (JP); Toru Kimura, Tokyo (JP); Masaki Goto, Tokyo (JP); Hiroyuki Yoshihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/370,803

(22) PCT Filed: Jul. 25, 2012

(86) PCT No.: PCT/JP2012/068864
§ 371 (c)(1),
(2), (4) Date: Jul. 7, 2014

(87) PCT Pub. No.: WO2013/114647
PCT Pub. Date: Aug. 8, 2013

(65) Prior Publication Data
US 2014/0367702 A1      Dec. 18, 2014

(30) Foreign Application Priority Data
Jan. 31, 2012   (JP) ................................ 2012-017601

(51) Int. Cl.
*H01L 23/367*       (2006.01)
*H01L 23/34*        (2006.01)
(Continued)

(52) U.S. Cl.
CPC ........ *H01L 23/3672* (2013.01); *H01L 21/4871* (2013.01); *H01L 21/4882* (2013.01);
(Continued)

(58) Field of Classification Search
CPC ............ H01L 23/3107; H01L 23/3672; H01L 29/1602; H01L 29/1608; H01L 29/2003; H01L 21/56
USPC ........ 257/76, 77, 706, 712, 713, 722, E23.08, 257/E23.103, E23.123, E23.124, E21.499, 257/E21.503; 165/80.1, 80.3, 185; 438/110, 438/113, 122, 124
See application file for complete search history.

(56) References Cited

U.S. PATENT DOCUMENTS 5,533,257 A * 7/1996 Romero et al. ............ 29/890.03
5,542,176 A   8/1996 Serizawa et al.
(Continued)

FOREIGN PATENT DOCUMENTS

JP    36 9565    7/1961
JP    54 75662   5/1979
(Continued)

OTHER PUBLICATIONS

U.S. Appl. No. 14/374,363, filed Jul. 24, 2014, Yamamoto, et al.
(Continued)

*Primary Examiner* — Dao H Nguyen
(74) *Attorney, Agent, or Firm* — Oblon, McClelland, Maier & Neustadt, L.L.P

(57) ABSTRACT

An object is to provide a fin integrated type semiconductor device and a method of manufacturing the same, which are provided with a simple structure and good heat dissipation characteristics. The semiconductor device includes: a base plate on which fins arranged in a standing condition are formed on a first main face; an insulating layer formed on a second main face of the base plate, the second main face being opposite to the first main face of the base plate; a circuit pattern fixed to the insulating layer; and a semiconductor element joined to the circuit pattern. The fins are formed with slits that pass through in the thickness direction of the fins.

19 Claims, 4 Drawing Sheets

(51) Int. Cl.

| | | |
|---|---|---|
| *B23P 15/26* | (2006.01) | |
| *H01L 23/433* | (2006.01) | |
| *H01L 21/48* | (2006.01) | |
| *H01L 23/31* | (2006.01) | |
| *H01L 21/56* | (2006.01) | |
| *H01L 23/373* | (2006.01) | |
| *H01L 29/16* | (2006.01) | |
| *H01L 29/20* | (2006.01) | |

(52) U.S. Cl.
CPC .............. *H01L21/56* (2013.01); *H01L 21/565* (2013.01); *H01L 23/3107* (2013.01); *H01L 23/3735* (2013.01); *H01L 23/4334* (2013.01); *H01L 29/1602* (2013.01); *H01L 29/1608* (2013.01); *H01L 29/2003* (2013.01); *H01L 2224/48091* (2013.01); *H01L 2224/48137* (2013.01); *H01L 2224/48247* (2013.01); *H01L 2924/181* (2013.01)

(56) References Cited

U.S. PATENT DOCUMENTS

| | | | | |
|---|---|---|---|---|
| 7,286,352 | B2 * | 10/2007 | Curtis et al. | 361/697 |
| 8,659,147 | B2 * | 2/2014 | Mitsui et al. | 257/713 |
| 2002/0070005 | A1 * | 6/2002 | Kawabata et al. | 165/80.3 |
| 2012/0112236 | A1 | 5/2012 | Higuma et al. | |

FOREIGN PATENT DOCUMENTS

| | | |
|---|---|---|
| JP | 2 78255 | 3/1990 |
| JP | 6 198383 | 7/1994 |
| JP | 7 312376 | 11/1995 |
| JP | 9 22970 | 1/1997 |
| JP | 2002 190558 | 7/2002 |
| JP | 2003 7935 | 1/2003 |
| JP | 2009 177038 | 8/2009 |
| JP | 2011 119488 | 6/2011 |
| JP | 2011-258594 | 12/2011 |
| TW | 201115796 A1 | 5/2011 |
| WO | WO 2011/061779 A1 | 5/2011 |

OTHER PUBLICATIONS

Combined Taiwanese Office Action and Search Report issued Mar. 16, 2015 in Patent Application No. 101127420 (with English language translation and English Translation of Category of Cited Documents).

International Search Report Issued Sep. 18, 2012 in PCT/JP12/068864 filed Jul. 25, 2012.

Office Action issued Sep. 1, 2015 in Japanese Patent Application No. 2013-556188 (with partial English translation).

Office Action issued on Dec. 9, 2015 for German Application No. 11 2012 005 791.0 (with English translation).

* cited by examiner

SEMICONDUCTOR DEVICE AND METHOD OF MANUFACTURING THE SAME

TECHNICAL FIELD

The present invention relates to semiconductor devices and, more particularly, relates to a semiconductor device provided with heat dissipation fins.

BACKGROUND ART

A semiconductor device is mounted with a semiconductor element that is a heating component. The semiconductor element dissipates heat in the case of driving the semiconductor device and becomes a high temperature. In order to enhance heat dissipation properties of the semiconductor device, a thick metal substrate or ceramic substrate, provided with a circuit pattern is used for a substrate that fixes the semiconductor element. There is also known a configuration in which a fin base formed with heat dissipation fins is screwed to be joined to a metal substrate and the heat dissipation area of the substrate is enlarged. A silicon-based resin material with insulation properties like grease intervenes between the fin base and the metal substrate.

A power semiconductor device having such a configuration needs to have a process of applying a silicon-based resin material on the front of the metal substrate, the ceramic substrate, or a heat dissipating member. Use of the silicon-based resin material makes the number of manufacturing processes increase and further makes heat dissipation properties deteriorate.

There is known, for example, Patent Document 1 as a technique in which a resin material is not made to intervene. In this case, a ceramic substrate is mounted on a metal substrate with fins. The whole of a semiconductor device is sealed with an epoxy resin. Patent Document 2 deals with a technique characterized by a method of manufacturing fins.

PRIOR ART DOCUMENT

Patent Document

Patent Document 1: Japanese Unexamined Patent Publication No. 2009-177038
Patent Document 2: Japanese Unexamined Patent Publication No. 2011-119488

SUMMARY OF THE INVENTION

Problems to be Solved by the Invention

The power semiconductor device sealed by a transfer mold process is excellent in mass productivity and/or long-term reliability. In order to further enhance reliability of the power semiconductor device, the metal substrate with fins is covered with resin up to the sides. In the case where transfer mold is performed without leaking a sealing resin on concave-convex portions of fins with respect to the metal substrate with fins, the outer periphery of the metal substrate needs to come into contact with a molding die. Dimensional tolerance is present in the height to the end of the fins; and thus, in consideration of this, a gap is provided between the molding die and the end of the fins. As a result, deformation is generated in the metal substrate due to temperature and molding pressure during molding of the sealing resin and accordingly insulation reliability of the power semiconductor device is deteriorated when a crack is generated in an insulating layer.

The present application is implemented to solve the foregoing problem; and an object thereof is to provide a fin integrated type semiconductor device and a method manufacturing the same, which are provided with a simple structure and good heat dissipation characteristics and quality.

Means for Solving the Problems

According to the present invention, there is provided a semiconductor device including: a metallic base plate on which fins arranged in a standing condition are formed on a first main face by integral processing; an insulating layer formed on a second main face of the base plate, the second main face being opposite to the first main face of the base plate; a circuit pattern fixed to the insulating layer; a semiconductor element joined to the circuit pattern; and a sealing resin which seals the insulating layer, the circuit pattern, and the semiconductor element. The fins are formed with slits that pass through in the thickness direction of the fins.

Advantageous Effect of the Invention

According to the present invention, in a transfer mold process of a process of manufacturing the semiconductor device, there can be used a molding die having a structure which prevents the metal base plate from being deformed and deflected by pressure during molding of the sealing resin. The generation of a crack of the insulating layer due to deformation can be suppressed and heat dissipation properties and insulation reliability of the power semiconductor device can be prevented from being deteriorated.

MODE FOR CARRYING OUT THE INVENTION

Hereinafter, embodiments of a semiconductor device and a method of manufacturing the same according to the present invention will be described in detail with reference to drawings. Incidentally, the present invention is not limited to the following description, but can be appropriately changed without departing from the spirit or scope of the present invention.

Embodiment 1

Figure 1:
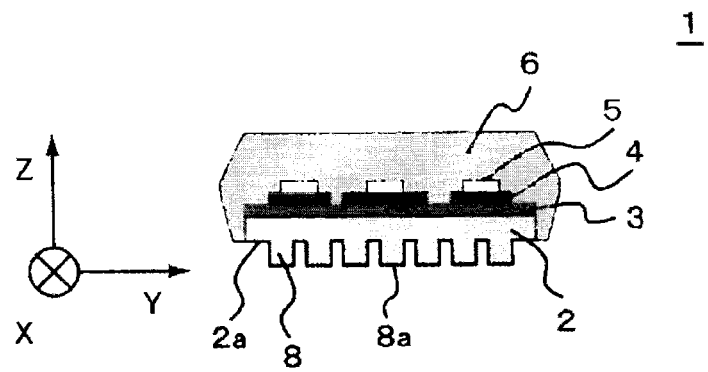
FIG. 1 is a sectional perspective view showing the side of a semiconductor device according to Embodiment 1 of the present invention.

FIG. 1 is a schematic side view showing the whole configuration of a semiconductor device 1 according to Embodiment 1 of the present invention 1. The semiconductor device 1 includes: a base plate 2, an insulating layer 3, a circuit pattern 4, a semiconductor element 5, a sealing resin 6, and the like. The back side (first main face) of the base plate 2 is formed with a plurality of convex fins 8. The sealing resin 6 is a molding member made of an epoxy-based resin and covers the base plate 2, the insulating layer 3, the circuit pattern 4, and the semiconductor element 5. The fins 8 are aligned in a Y direction (thickness direction of the fins) at predetermined intervals. An end portion 8a of the fin 8 is made to be flat.

The base plate 2 is a base substrate of the semiconductor device 1 and also combines with the role of heat dissipation fins by being formed with the fins 8. The base plate 2 is made of a metal material, such as aluminum, copper, or the like, which is high in coefficient of thermal conductivity and good in heat dissipation properties. In this case, description is made on the case where a metal substrate is used as the base plate 2; however, a ceramic substrate may be used. The base plate 2 is formed with a mounting face 2a. The fins 8 may previously have a sufficient length; however, in consideration of mass productivity during molding, the fins 8 are designed to be short in Embodiment 1.

The insulating layer 3 is directly formed on the front of the base plate 2. In the case where the insulating layer 3 is an epoxy-based resin, in order to enhance heat dissipation properties, a single or a plurality of combined inorganic powder, such as silica, alumina, boron nitride, or aluminum nitride may be filled in the resin, the inorganic powder being high in coefficient of thermal conductivity. The circuit pattern 4 is formed on the insulating layer 3 by etching processing or the like. The circuit pattern 4 is mounted with an electronic component such as the semiconductor element 5 with solder or the like.

In addition to those formed by silicon (Si), the semiconductor element 5 may be also formed by a wide band gap semiconductor that is larger in band gap than silicon. As the wide band gap semiconductor, there exist, for example, silicon carbide (SiC), gallium nitride-based material, or diamond. In the case where the wide band gap semiconductor is used, permissible current density is high and power loss is also low; and therefore, miniaturization of a device using a power semiconductor element can be achieved.

Figure 2:
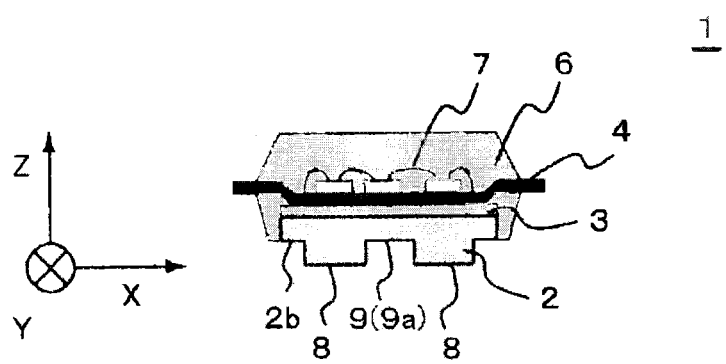
FIG. 2 is a sectional perspective view showing the front of the semiconductor device according to Embodiment 1 of the present invention.

FIG. 2 is a schematic front view showing the whole configuration of the semiconductor device 1 shown in FIG. 1. The circuit pattern 4 is electrically connected to the semiconductor element 5 with a bonding wire 7. The sealing resin 6 doubles as a case of the semiconductor device 1. The fin 8 is formed with slit 9. The slits 9 pass through the plurality of the fins 8 in the Y direction, and the rear sides thereof are opened. The base 9a of the slit 9 is formed to be the same height as the mounting face 2a of the base plate 2.

A range covered with the sealing resin 6 is preferable to cover not only the front side of the base plate 2 but also up to the sides thereof. This prevents the semiconductor device 1 from generating a warpage and a crack due to thermal stress or the like and leads to an increase in reliability. A material of the sealing resin 6 is not particularly limited; however, in order to suppress the whole warpage of the semiconductor device 1, it is preferable that the inorganic powder such as silica is filled to bring a thermal expansion coefficient of the sealing resin 6 close to a thermal expansion coefficient of copper, the semiconductor element, and the like.

Figure 3:
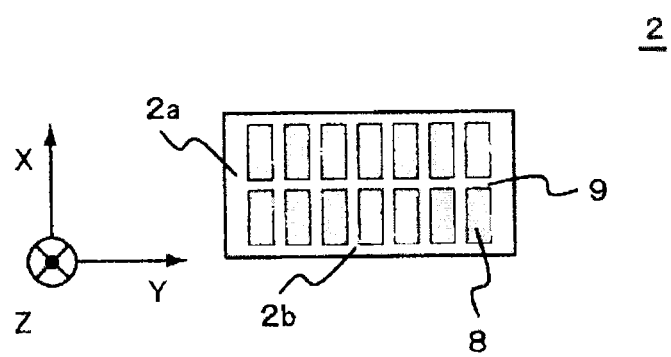
FIG. 3 is a projection view showing the back of a base plate according to Embodiment 1 of the present invention.

FIG. 3 shows the configuration of the base plate 2 according to Embodiment 1 of the present invention. The fins 8 arranged in a standing condition on the mounting face 2a of the base plate 2 are linearly extended in an X direction (length direction). A plurality of slits 9 respectively formed in the plurality of fins 8 pass through the plurality of aligned fins 8 in a straight line. The base plate 2 is formed with the margin of width 2b at a constant width from an outer peripheral end portion. The mounting face 2a is pressed against a molding die; and thus, resin can be molded by covering up to the sides of the base plate 2 without leaking the sealing resin on the fins 8 formed on the backside face of the base plate 2 (see FIG. 5 and FIG. 6).

The slits 9 pass through in the Y direction and thus an effect of the present invention is more effective; however, the slits 9 may pass through only a part. The position of the slits 9 formed at nearer to the center of the base plate 2 is higher in effect, which can suppress deformation during resin molding; and thus, the position of the slits 9 is preferable to be formed at the center, but not particularly limited. The number of passing-through slits 9 to be formed is also preferable to be one in consideration of heat dissipation properties; however, a plural number of the slits 9 to be formed is higher in deformation suppression effect of the base plate 2 during resin molding and thus the slits 9 may be formed in plural number.

Figure 4:
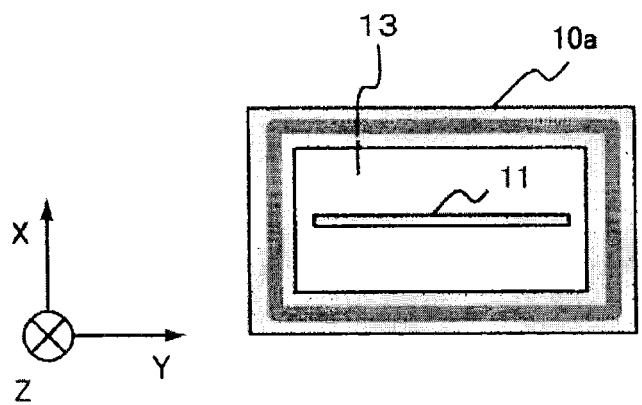
FIG. 4 is a view showing the structure of a molding die according to Embodiment 1 of the present invention.

The molding die is used for a transfer mold process. FIG. 4 shows the schematic configuration of the molding die according to Embodiment 1 of the present invention. The molding die is composed of a lower die and an upper die; however, only a lower die 10a is shown in this case. The lower die 10a is formed with a partition portion 11 at a position corresponding to the slits 9. The partition portion 11 is arranged in a standing condition from the base 13 of the lower die 10a.

Next, a method of manufacturing the semiconductor device 1 according to the thus configured Embodiment 1 will be described. First, linearly shaped fins 8 are formed at a plurality of positions at predetermined intervals on one face of the base plate 2 of aluminum or the like. The fins 8 are formed with the slits 9 passing through in the thick direction, respectively. As for the depth of the slit 9, the base 9a is preferable to be the same height as the mounting face 2a of the base plate 2 from the viewpoint of the transfer mold process. Next, the epoxy-based resin is applied on the front face (second main face) of the base plate 2 to form the insulating layer 3; and the circuit pattern 4 made of, for example, copper is formed on the insulating layer 3 by using etching processing or the like.

Next, solder paste is applied at a predetermined position of the circuit pattern 4. An electronic component such as the semiconductor element 5 is mounted on the solder paste and subsequently reflow is performed. More specifically, the base plate 2 with the fins 8 is heated to a high temperature; and the applied solder paste is melted at the high temperature to electrically connect the electronic component such as the semiconductor element 5 to the circuit pattern 4. The circuit pattern 4 is electrically connected to the semiconductor element 5 with the bonding wire 7.

Figure 5:
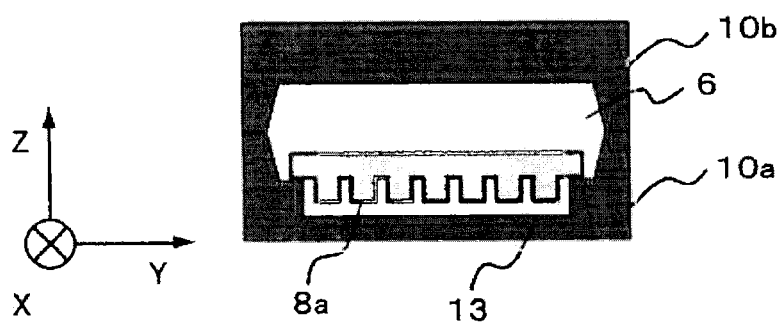
FIG. 5 is a side perspective view showing during resin molding of the semiconductor device according to Embodiment 1 of the present invention.
Figure 6:
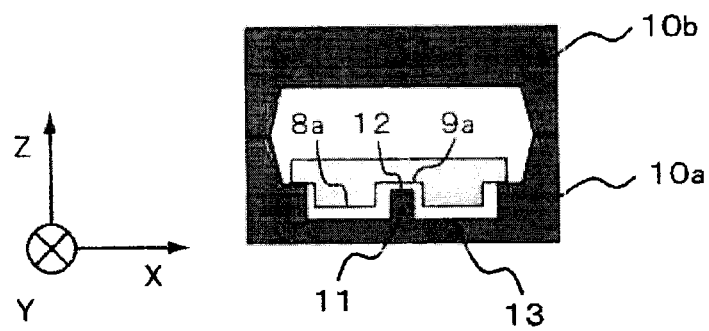
FIG. 6 is a front perspective view showing during resin molding of the semiconductor device according to Embodiment 1 of the present invention.

Next, in order to seal the whole of the insulating layer 3, the circuit pattern 4, the semiconductor element 5, and the like by transfer mold, the whole is placed on the molding die 10 as shown in FIG. 5 and FIG. 6 and the sealing resin is casted. There is also conceivable a procedure in which the circuit pattern 4 mounted with the semiconductor element 5 is mounted on the base plate 2 formed with the insulating layer 3 and then the sealing resin is casted. The partition portion 11 is formed on the lower die 10a at the position corresponding to the slits 9. An end portion 12 of the partition portion 11 according to Embodiment 1 is made to be flat. A slight gap is preferable to be provided between the end portion 12 and the base 9a of the base plate. The base plate 2 is manufactured by extrusion molding, forging, or the like of aluminum in order to reduce in cost and thus tolerance is generated in outside dimensions including the fins; however, a design is made so as to generate a gap between the end portion 8a of the fin 8 and the base 13 of the lower die 10a.

In the case of sealing with the resin, the epoxy-based resin may be casted in depressurized atmosphere. This can suppress the generation of a void to be generated in the epoxy-based resin. The casted epoxy-based resin is hardened by being heated to a molding die temperature and can be taken out from the molding die 10. Subsequently, heat treatment may be performed by an oven or the like in order to further harden as needed.

Description will be made on an effect of using the base plate 2 formed with the slits 9 in the transfer mold process with the epoxy-based resin. In the process of resin molding after installing on the molding die 10, the base plate 2 of aluminum or the like is deformed at a high temperature due to molding pressure of the resin. Even when the base plate 2 is deformed, the partition portion 11 comes into contact with the base 9a of the slit 9; and therefore, the deformation of the base plate 2 is suppressed. On the other hand, if the partition portion 11 is not present, the generation of a crack, peeling-off, and the like of the insulating layer is caused by warpage deformation and residual stress of base plate 2 during molding and accordingly insulation reliability is deteriorated.

There is also conceivable a structure in which the end portion 8a of the fins 8 and the base 9a are supported by the molding die in order to prevent deformation of the base plate 2 during molding; however, tolerance is present in the outside dimensions of the base plate 2. A consideration is made on the case where the end portion 8a of the fin 8 is designed to be pressed against the base 13 of the molding die 10. In the case where the metal base plate higher than the partition portion 11 is installed although the height of the fins is within dimensional tolerance, a gap is generated between an outer periphery portion of the base plate and the molding die and accordingly a leakage of the epoxy-based resin is generated on the concave-convex face of the fins 8.

Even in the case of a structure in which the base 9a of the slits 9 is supported by the partition portion 11, in addition to the aforementioned similar problem, a space to which the partition portion by the molding die is inserted is needed. Furthermore, there is also conceivable a structure in which the partition portion 11 is inserted into a gap between the fins. In either case, the number of lines to be formed reduces and accordingly heat dissipation properties deteriorate. Due to these problems, in order to prevent the resin from leaking during molding, formation needs to be made by using the molding die which is designed so as to provide a certain amount of gap between the end portion 8a of the fins and the base 13 of the molding die.

The present invention is characterized in that the base plate formed with the slit structure is used. The slit structure is supported by the molding die; and thus, the amount of deformation of the base plate can be minimized against pressure during molding. As compared to the conventional semiconductor device, the generation of a crack and peeling-off of the insulating layer after sealing with the epoxy-based resin is considerably suppressed and long-term reliability is improved. Furthermore, the slit shape is formed in a vertical direction with respect to the length direction of the fins; and thus, deformation of the metal base plate during molding can be prevented without reducing the quantity of fin-shaped convex portions that contribute to heat dissipation. Therefore, deterioration of heat dissipation properties can also be minimized as a final product.

Embodiment 2

Figure 7:
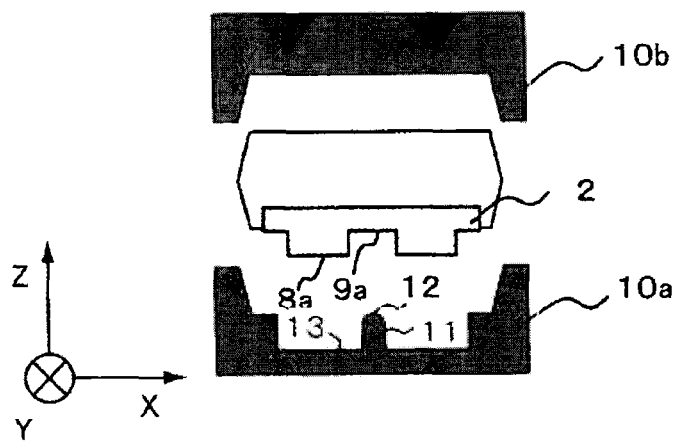
FIG. 7 is a view showing the structure of a molding die according to Embodiment 2 of the present invention.
Figure 8:
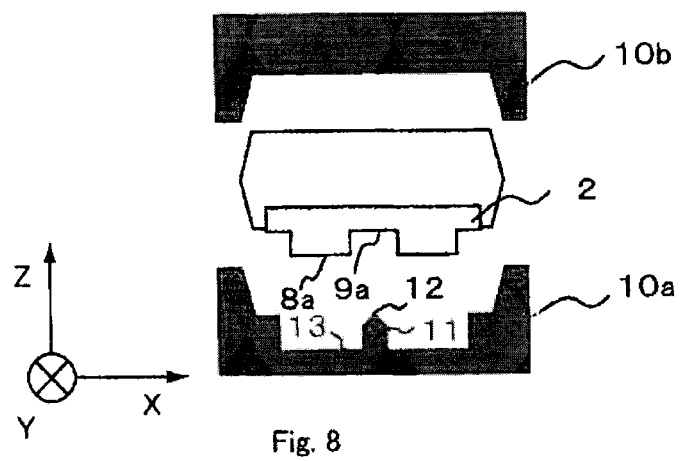
FIG. 8 is a view showing the structure of a different molding die according to Embodiment 2 of the present invention.

A method of manufacturing a semiconductor device in Embodiment 2 is characterized by a partition portion 11 of a molding die 10. FIG. 7 and FIG. 8 each shows an example of the shape of an end portion 12 of the partition portion 11. The end portion 12 of the partition portion 11 is formed in a semicircular shape (see FIG. 7) and a triangle shape (see FIG. 8). Except for this, Embodiment 2 is manufactured as in Embodiment 1. This method is adopted; and thus, the end portion 12 of the molding die 10 can be pressed against a base 9a of slits 9. Incidentally, the end shape of the partition portion 11 is not limited to the semicircular shape and the triangle shape.

An area to be pressed against the base 9a of the slit 9 by the end portion 12a of the partition portion 11 is made to be reduced; and thus, the end portion 12 of the molding die 10 is dug into a base plate 2 that deforms due to molding pressure. In Embodiment 1, when a design is made with dimensions in which the molding die is pressed against the base 9a of the slits 9 to support, there arises a case where the base plate 2 is supported by the end portion 12 of the molding die 10 depending on dimensional tolerance and accordingly it is conceivable that the molding die 10 is deformed during resin molding. In the case where the slits 9 are provided in a straight line, the end portion 12 of the molding die can be designed to come close to the base 9a of the slit 9 to the utmost limit and the amount of deformation during molding can be considerably suppressed.

In Embodiment 1, it is preferable to provide the slight gap between the end portion of the molding die and the base plate. According to Embodiment 2, an area where the base plate is pressed by the end portion is reduced. The supporting area of the end portion is reduced; and thus, this gap is further narrowed; and in some cases, formation can be made by a design value to be pressed against the molding die. This further suppresses the generation of a crack or the like with respect to an insulating layer after die molding of the semiconductor device.

Embodiment 3

Figure 9:
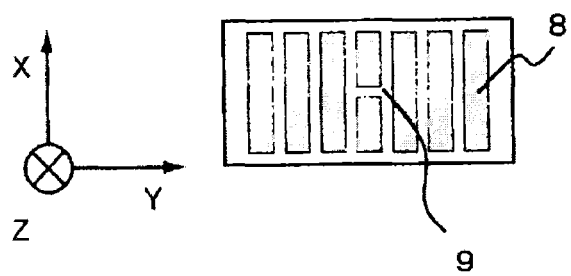
FIG. 9 is a projection view showing the back of a base plate according to Embodiment 3 of the present invention.

Heat dissipation properties of a semiconductor device 1 is determined by the number and the surface area of linearly formed fins 8. In Embodiment 1, the groove-like slits 9 are formed vertically with respect to the linearly disposed fins 8. The partition portion 11 of the molding die can prevent linear deformation and therefore is the other hand, in Embodiment 3, there is used a manufacturing method in which partly non-contiguous fins 8 are formed at a central portion of a base plate 2 as shown in FIG. 9 and supporting is made by this portion, in a range where the amount of deformation is suppressed by the thickness of the base plate 2, molding pressure due to a transfer mold process, and the like. This can ensure reliability of an insulating layer without reducing heat dissipation performance of the semiconductor device as much as possible as compared to the structure of Embodiment 1.

Embodiment 4

Fins 8 formed on one face of a base plate 2 may be directly used as heat dissipation fins; however, in order to enhance performance of the heat dissipation fins, it is conceivable to further heighten the fins 8. If the fins 8 are directly heightened, the processing accuracy of the base plate 2 is deteriorated and processing itself is also difficult. Furthermore, as for a manufacturing process, a lower die 10*a* needs to be deeply engraved in response to the height of the fins 8 of the base plate 2, and a molding die itself further increases in size and accordingly productivity is deteriorated. In order to solve this, Embodiment 4 provides a structure in which heat dissipation fins are linked (linkage structure of fins).

Figure 10:
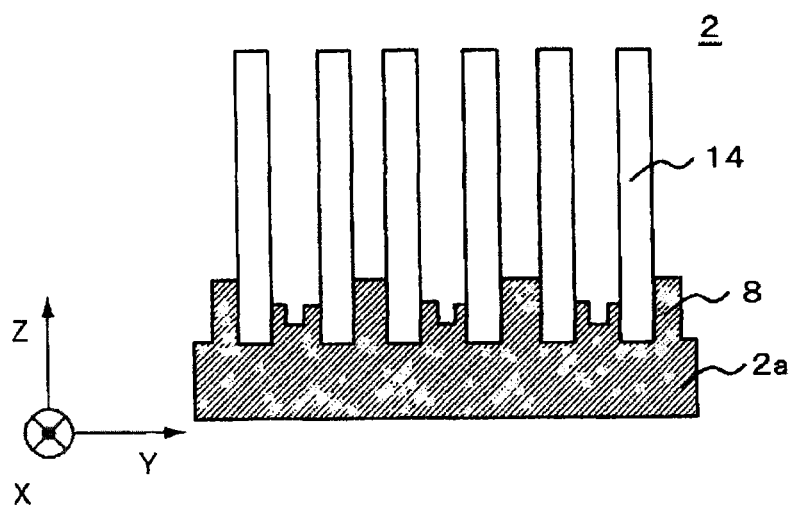
FIG. 10 is a sectional view showing the configuration of a base plate according to Embodiment 4 of the present invention.

FIG. 10 is a view for explaining the linkage structure of fins. Linkage fins 14 made of aluminum or the like are made to be swaged to the fins 8 explained in Embodiment 1 after molding of a sealing resin; and thus, the fins 8 and the linkage fins 14 are integrated. The heat dissipation area of the heat dissipation fins increases and a semiconductor device with higher heat dissipation properties can be obtained. As for an epoxy resin for use in a sealing resin 6, it is preferable to use an epoxy-based resin having mechanical strength to such an extent that does not split off against stress such as pressing pressure in the case of swaging.

In the case of using SiC for a semiconductor element 5, a semiconductor device 1 is made to operate at a higher temperature than the case of Si in order to make use of characteristics thereof. The semiconductor device mounted with an SiC device is required for higher reliability as the semiconductor device; and therefore, the merit of the present invention that achieves a high reliability semiconductor device is more effective.

Incidentally, aluminum or copper with a high coefficient of thermal conductivity is used as the base plate 2 in the present invention. These metals with a high coefficient of thermal conductivity are often less than or equal to Hv200 as Vickers hardness; and accordingly, the metals are likely to be deformed depending on molding pressure. The size of the base plate 2 is 50 mm by 70 mm, but not limited to this size. The thickness of a flanged portion (the margin of width 2*b*) of an outer peripheral portion is 5 mm; and the overall thickness including the fins of the base plate 2 is 10 mm. When the external size of the base plate 2 is equal to or more than 50 mm, warpage deformation is likely to be occurred. Normally, the thickness (width) of the fin is set to be larger than the interval between the fins (see FIG. 3).

Furthermore, a transfer mold type module in which an insulation sheet is applied to an insulating layer 3 is highly filled with a filling material with high thermal conductivity in order to enhance a coefficient of thermal conductivity of the insulation sheet. Thus, in order to achieve a desired coefficient of thermal conductivity, high molding pressure is needed in the case of performing transfer mold. As for the molding pressure in the case of sealing by transfer mold, molding is made by applying a pressure of, for example, 100 kg/cm$^2$ in order to ensure performance of the insulation sheet highly filled with the filling material. The epoxy-based resin casted by transfer mold is hardened by being heated to a molding die temperature and is taken out from the molding die, for example, after molding for 2 min. In this case, aside from a partition portion formed on the die, the base plate (or the semiconductor device) can be taken out by pressing an ejector pin, which is for assisting to release from the molding die, to the base plate. The ejector pin is one that can be moved.

Besides, as shown in Embodiment 2, an end portion of the partition portion is made to be a circular arc or a sharp angle; and thus, an area in which the end portion of the partition portion is pressed against the base of slits becomes small. This makes the end portion of the molding die dig into the base plate to be deformed by the molding pressure. As in Embodiment 1, when the end portion is flat, for example, a gap of approximately 50 μm needs to be provided between the end portion of the partition portion and the base of the slits in consideration of dimensional tolerance of the base of the base plate in order to support by pressing the molding die against the base of the slits. The end of the partition portion is made to be the circular arc or the sharp angle; and thus, this slight gap can be further narrowed. When the gap is made to be narrow, it is assumed that the end of the partition portion comes into contact with the base of the slits and the outer peripheral portion of the base plate does not come into contact with the molding die, depending on dimensional tolerance of the base plate. However, the base plate is pressed against the molding die by the molding pressure in the case of performing transfer mold and the end of the partition portion is dug into the base of the slits; and thus, the outer peripheral portion of the base plate comes into contact with the molding die. This can perform transfer mold without causing the epoxy-based resin to come around behind the back of the base plate.

Incidentally, the present invention can freely combine the respective embodiments and appropriately change or omit the respective embodiments, within the scope of the present invention.

DESCRIPTION OF REFERENCE NUMERALS

1 Semiconductor device, 2 Base plate, 2*a* Mounting face, 3 Insulating layer, 4 Circuit pattern, 5 Semiconductor element, 6 Sealing resin, 7 Bonding wire, 8 Fin, 8*a* End portion, 9 Slit, 9*a* Base, 10 Molding die, 11 Partition portion, 13 Base, 14 Linkage fin

The invention claimed is:

1. A semiconductor device comprising:
    a metallic base plate on which a fin arranged in a standing condition and a convex wall arranged in a standing condition are formed on a first main face by integral processing;
    an insulating layer formed on a second main face of said base plate, the second main face being opposite to the first main face of said base plate;
    a circuit pattern fixed to said insulating layer;
    a semiconductor element joined to said circuit pattern; and
    a sealing resin which seals said insulating layer, said circuit pattern, and said semiconductor element,
    wherein said fin is formed with a slit that passes through in a thickness direction of said fin,
    a margin of width is provided on said first main face of said base plate to surround said fin,
    a side of said base plate is covered with said sealing resin all around but said margin of width of said base plate is laid open to said sealing resin,
    said convex wall is lower than said fin in height,
    and a linkage fin is swaged to be fixed between said convex wall and said fin,
    and further wherein an indentation is produced on a base of said slit that passes through in said thickness direction of said fin.

2. The semiconductor device according to claim 1, wherein said insulating layer includes inorganic powder.

3. The semiconductor device according to claim 1, wherein said fin is formed in plural on said base plate by integral processing and the thickness of said fins in the plural is larger than the interval between said fins.

4. The semiconductor device according to claim 1, wherein the slit is formed at the center of said fin.

5. The semiconductor device according to claim 1, wherein at least a part of said semiconductor element is formed by a wide band gap semiconductor, said wide band gap semiconductor is any semiconductor of silicon carbide, gallium nitride-based material, or diamond.

6. The semiconductor device according to claim 1;
said base plate has a concave wall made of the two neighboring convex walls.

7. A semiconductor device comprising:
a metallic base plate on which a fin arranged in a standing condition is formed on a first main face by integral processing;
an insulating layer formed on a second main face of said base plate, the second main face being opposite to the first main face of said base plate;
a circuit pattern fixed to said insulating layer;
a semiconductor element joined to said circuit pattern; and
a sealing resin which seals said insulating layer, said circuit pattern, and said semiconductor element,
wherein said fin is formed with a slit that passes through in a thickness direction of said fin,
said base plate is formed, on the first main face, with a margin of width which surrounds said fin,
a side of said base plate is covered with the sealing resin, and said margin of width of said base plate is laid open to the sealing resin,
and further wherein an indentation is produced on a base of said slit that passes through in said thickness direction of said fin.

8. The semiconductor device according to claim 7,
wherein said insulating layer includes inorganic powder.

9. The semiconductor device according to claim 7,
wherein said fin is formed in plural on said base plate by integral processing and the thickness of said fins in the plural is larger than the interval between said fins.

10. The semiconductor device according to claim 7,
wherein the slit is formed at the center of said fin.

11. The semiconductor device according to claim 7,
wherein at least a part of said semiconductor element is formed by a wide band gap semiconductor, said wide band gap semiconductor is any semiconductor of silicon carbide, gallium nitride-based material, or diamond.

12. The method of manufacturing a semiconductor device according to claim 7, wherein said base plate has a concave wall made of the two neighboring convex walls.

13. A method of manufacturing a semiconductor device, said method comprising:
a step of forming a metallic base plate on which a fin and a convex wall are arranged in a standing condition by integral processing, said fin being formed to with a slit that passes in a thickness direction of said fin, said base plate having a margin of width arranged at an outer peripheral end portion to surround said fin and said convex wall being lower than said fin in height,
a step of fixing a semiconductor element to said base plate;
a step of placing said base plate on which said semiconductor element is fixed, with said fin and said convex wall facing the downside, on a lower die in which a partition portion arranged in a standing condition from a base of a hollow portion is located at a position corresponding to said slit;
a step of overlaying an upper die on said lower die, on which said base plate is placed with said margin of width of said base plate keeping in contact with an upper face of said hollow portion of said lower die, to make a molding die and sealing a molding resin to said molding die;
a step of hardening said sealed molding resin by heating; and
a step of swaging a linkage fin between said convex wall and said fin to be fixed, after said molding resin is hardened,
wherein a height of the said fin is smaller than a depth of the hollow portion and a height of the partition portion.

14. The method of manufacturing the semiconductor device according to claim 13, wherein the end of said partition portion is made to be flat.

15. The method of manufacturing the semiconductor device according to claim 13, wherein the end of said partition portion is made to be a circular arc.

16. The method of manufacturing the semiconductor device according to claim 13, wherein the end of said partition portion is made to be a sharp angle.

17. The method of manufacturing a semiconductor device according to claim 13, wherein said base plate has a concave wall made of the two neighboring convex walls.

18. A method of manufacturing a semiconductor device, said method comprising:
a step of forming a metallic base plate on which a fin is arranged in a standing condition by integral processing, said fin being formed with a slit that passes in a thickness direction of said fin, the base plate having a margin of width arranged at an outer peripheral end portion, and the margin of width surrounding said fin;
a step of fixing a semiconductor element to said base plate;
a step of placing said base plate on which said semiconductor element is fixed, with said fin and said margin of width facing the downside, on a lower die in which a partition portion arranged in a standing condition from a base of a hollow portion is located at a position corresponding to said slit;
a step of overlaying a upper die on said lower die, on which said base plate is placed with said margin of width of said base plate keeping in contact with an upper face of said hollow portion of said lower die, to make a molding die and sealing a molding resin to said molding die; and
a step of hardening said sealed molding resin by heating,
wherein a height of the said fin is smaller than a depth of said hollow portion and a height of said partition portion.

19. The method of manufacturing a semiconductor device according to claim 18, wherein said base plate has a concave wall made of the two neighboring convex walls.

* * * * *